(12) United States Patent
Akao et al.

(10) Patent No.: US 8,486,222 B2
(45) Date of Patent: Jul. 16, 2013

(54) SUBSTRATE PROCESSING APPARATUS AND METHOD OF MANUFACTURING A SEMICONDUCTOR DEVICE

(75) Inventors: Tokunobu Akao, Toyama (JP); Unryu Ogawa, Toyama (JP); Masahisa Okuno, Toyama (JP); Shinji Yashima, Toyama (JP); Atsushi Umekawa, Toyama (JP); Kaichiro Minami, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 159 days.

(21) Appl. No.: 13/239,902

(22) Filed: Sep. 22, 2011

(65) Prior Publication Data
US 2012/0108080 A1  May 3, 2012

(30) Foreign Application Priority Data

Oct. 28, 2010  (JP) .................................. 2010-241891
Jun. 24, 2011  (JP) .................................. 2011-140105

(51) Int. Cl.
*C23F 1/00* (2006.01)
*H01L 21/306* (2006.01)

(52) U.S. Cl.
USPC ............. 156/345.41; 156/345.42; 156/345.1; 414/217; 414/935; 414/221; 414/940; 438/107; 438/149; 438/485; 438/688; 438/759

(58) Field of Classification Search
USPC ............. 156/345.41, 345.42, 345.1; 414/217, 414/935, 221, 940; 438/107, 149, 485, 688, 438/759, 713, 727
See application file for complete search history.

(56) References Cited

U.S. PATENT DOCUMENTS

| | | | | |
|---|---|---|---|---|
| 5,545,258 | A | * | 8/1996 | Katayama et al. ..... 118/723 MP |
| 5,874,706 | A | * | 2/1999 | Ishii et al. ................. 219/121.43 |
| 6,514,073 | B1 | * | 2/2003 | Toshima et al. .................. 432/85 |
| 6,797,111 | B2 | * | 9/2004 | Hongoh et al. ........... 156/345.41 |
| 2011/0311339 | A1 | * | 12/2011 | Yasui et al. .................... 414/217 |
| 2012/0086107 | A1 | * | 4/2012 | Yamamoto et al. ........... 257/632 |

FOREIGN PATENT DOCUMENTS

| | | |
|---|---|---|
| JP | 63-027022 A | 2/1988 |
| JP | 03-036274 A | 2/1991 |
| JP | 2003-059919 A | 2/2003 |
| JP | 2004296820 | 10/2004 |
| KR | 10-0156011 B1 | 12/1998 |
| KR | 10-2002-0035594 A | 5/2002 |
| KR | 10-2010-0109893 A | 10/2010 |
| WO | 01/18860 A2 | 3/2001 |

* cited by examiner

*Primary Examiner* — Telly Green
(74) *Attorney, Agent, or Firm* — Volpe and Koenig, P.C.

(57) ABSTRACT

A substrate processing apparatus includes a processing chamber configured to process a substrate, a substrate support member provided within the processing chamber to support the substrate, a microwave generator provided outside the processing chamber, a waveguide launch port configured to supply a microwave generated by the microwave generator into the processing chamber, wherein the central position of the waveguide launch port is deviated from the central position of the substrate supported on the substrate support member and the waveguide launch port faces a portion of a front surface of the substrate supported on the substrate support member, and a control unit configured to change a relative position of the substrate support member in a horizontal direction with respect to the waveguide launch port.

9 Claims, 5 Drawing Sheets

SUBSTRATE PROCESSING APPARATUS AND METHOD OF MANUFACTURING A SEMICONDUCTOR DEVICE

CROSS-REFERENCE TO RELATED APPLICATIONS

This application is based upon and claims the benefit of priority from Japanese Patent Application Nos. 2010-241891, filed on Oct. 28, 2010 and 2011-140105, filed on Jun. 24, 2011, the entire contents of which are incorporated herein by reference.

TECHNICAL FIELD

The present disclosure relates to a substrate processing technique for forming semiconductor devices such as integrated circuits (ICs) on a substrate, and more particularly, to a semiconductor manufacturing apparatus which is capable of using a microwave to process a substrate such as a semiconductor wafer (hereinafter referred to as "wafer") or the like, a substrate processing apparatus for processing a substrate, and a method of manufacturing a semiconductor device.

BACKGROUND

There exists a chemical vapor deposition (CVD) process for forming film on a surface of a single substrate (an object substrate having fine patterns of electrical circuits formed thereon with a silicon wafer or glass as a base) in a semiconductor manufacturing process. In the CVD process, a substrate is loaded into an airtight reaction chamber and heated by a heater provided within the reaction chamber to cause a chemical reaction while film forming gas is being supplied onto the substrate, so that film can be uniformly formed on fine patterns of electrical circuits formed on the substrate. According to such a CVD process, for example, organic chemical material may be used as film forming raw material to form a high-k film, such as a HfO film or the like, which is an insulating film having a high dielectric constant.

Since a HfO film formed in this way contains a considerable amount (i.e., several percentages) of impurities such as CH, OH or the like due to the organic chemical material, it has insufficient electrical insulating property. In order to secure sufficient electrical insulating property and stability of such a film, attempts have been made to reform the HfO film into a densified and stable film by subjecting the HfO film to a fast annealing treatment at about 650° C. to 800° C. under an $O_2$ or $N_2$ atmosphere, thereby removing impurities such as C, H and the like from the film. Such densification is performed to shorten the average interatomic distance in an amorphous state, although it does not lead to crystallization. Such a fast annealing treatment heats the entire substrate to a predetermined temperature to reform the HfO film.

In recent years, semiconductor devices may have a shallow junction structure with miniaturization and require a low thermal budget (thermal history). Accordingly, the annealing treatment used in the above-described high-k forming process requires removing of impurities from the film at a low temperature for film densification in order to provide a low thermal budget. The reason for the low temperature annealing treatment is as follows. Generally, in a process of manufacturing a device, if the device is treated in a later step at a temperature higher than that used in an earlier step, the device already built up in the earlier step may collapse or a film thereof may change in its characteristics. Therefore, the device cannot be treated in the later step at a temperature exceeding that used in the earlier step. Accordingly, there is a demand for a technique which can perform a film reforming process for improved device performance at a low temperature.

Japanese Patent Application Laid-Open Publication No. 2004-296820 discloses a technique in which, in a film depositing process, a hafnium-containing thin film is formed on a substrate, and, in a film reforming process, argon radicals are supplied onto the substrate so as to remove impurity elements contained in the thin film formed in the film depositing process.

SUMMARY

The present disclosure provides some embodiments of a substrate processing apparatus which is capable of heating a substrate uniformly while further restricting a thermal budget by suppressing an increase in a substrate temperature, as compared to conventional techniques.

The present disclosure suggests a technique for heating a substrate uniformly by irradiating a position deviated from the center of the substrate with a microwave while rotating the substrate. According to one embodiment of the present disclosure, there is provided a substrate processing apparatus including: a processing chamber configured to process a substrate; a substrate support member provided within the processing chamber to support the substrate; a microwave generator provided outside the processing chamber; a waveguide launch port configured to supply a microwave generated by the microwave generator into the processing chamber, wherein the central position of the waveguide launch port is deviated from the central position of the substrate supported on the substrate support member and the waveguide launch port faces a portion of a front surface of the substrate supported on the substrate support member; and a control unit configured to change a relative position of the substrate support member in a horizontal direction with respect to the waveguide launch port.

According to another embodiment of the present disclosure, there is provided a method of manufacturing a semiconductor device using a substrate processing apparatus including a processing chamber configured to process a substrate, a substrate support member provided within the processing chamber to support the substrate, a microwave generator provided outside the processing chamber, a waveguide launch port configured to supply a microwave generated by the microwave generator into the processing chamber, wherein the central position of the waveguide launch port is deviated from the central position of the substrate supported on the substrate support member and the waveguide launch port faces a portion of a front surface of the substrate supported on the substrate support member, and a control unit configured to relatively rotate the substrate support member in a horizontal direction with respect to the waveguide launch port, the method including: loading the substrate into the processing chamber; supporting the substrate on the substrate support member provided in the processing chamber; relatively rotating the substrate support member supported on the substrate support member in the horizontal direction with respect to the waveguide launch port; irradiating the front surface of the substrate with the microwave after starting rotating the substrate; and unloading the substrate out of the processing chamber.

DETAILED DESCRIPTION

Figure 1:
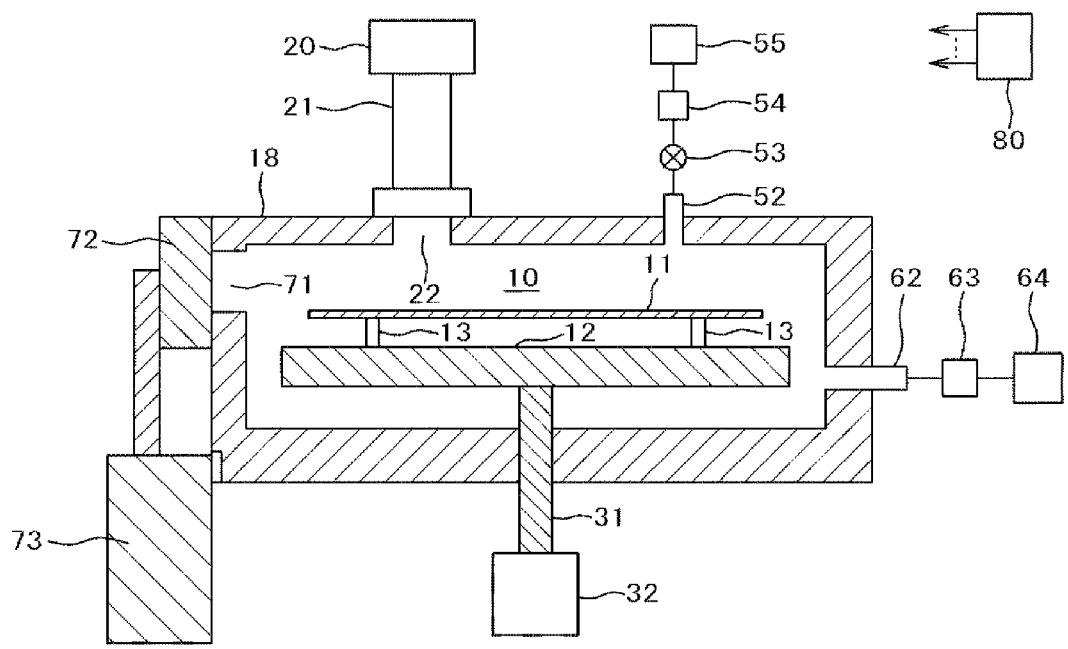
FIG. 1 is a vertical sectional view of a substrate processing apparatus according to an embodiment of the present disclosure.

First, general configuration of a substrate processing apparatus according to an embodiment of the present disclosure will now be described with reference to FIG. 1. FIG. 1 is a vertical sectional view of the substrate processing apparatus according to an embodiment of the present disclosure. The substrate processing apparatus 100 includes a processing chamber 10, a transfer chamber (not shown) and a microwave supplying unit. The processing chamber 10 processes a wafer 11 as a semiconductor substrate. The microwave supplying unit includes a microwave generator 20, a waveguide 21 and a waveguide launch port 22.

The microwave generator 20 generates a microwave such as a fixed frequency microwave or a variable frequency microwave. An example of the microwave generator 20 may include a microtron or the like. The microwave generated in the microwave generator 20 is supplied into the processing chamber 10 from the waveguide launch port 22 connecting with the processing chamber 10 via the wave guide 21.

A processing vessel 18 forming the processing chamber 10 is made of metal such as aluminum (Al), stainless steel (SUS) or the like and has a structure to shield the processing chamber 20 from the external environment.

Within the processing chamber 10 are provided substrate support pins 13 for supporting the wafer 11. The substrate support pins 13 are provided in such a manner that the center of the supported wafer 11 substantially coincides with the center of the processing chamber 10 in a vertical direction. The substrate support pins 13 configured to support the wafer 11 are made of a material such as quartz, Teflon® or the like and the number thereof is plural (three in this embodiment).

The substrate supporting table 12 having a conductive property is provided below the wafer 11 at the lower part of the substrate support pins 13. The substrate supporting table 12 is made of a conductive metal material such as aluminum (Al) or the like. The substrate supporting table 12 is a disc-like or cylindrical plate whose outer diameter is larger than that of the wafer 11. In this manner, the substrate supporting table 12 is provided below and in parallel to the rear surface of the wafer 11 supported by the substrate support pins 13. The substrate supporting table 12 has an opposing surface facing the rear surface of the wafer 11.

A substrate support member is constituted by the substrate support pins 13 and the substrate supporting table 12.

The substrate supporting table 12 is supported by a rotation axis 31 made of a metal such as stainless steel (SUS) or the like, and the rotation axis 31 is rotated in a horizontal direction by a rotation driver 32. Accordingly, the rotation axis 31, the substrate supporting table 12 and the wafer 11 can be rotated in a horizontal direction by the rotation driver 32. The rotation driver 32 is electrically connected to and controlled by a control unit 80.

A gas inlet 52 for supplying a gas such as nitrogen ($N_2$) or the like is provided at an upper wall of the processing chamber 10 in the upper part of the processing vessel 18. The gas inlet 52 is connected to a gas source 55, a flow rate controller 54 for regulating a gas flow rate, and a valve 53 for opening/closing a gas passage in this order from an upstream. By opening/closing the valve 53, gas is supplied or shut off from the gas inlet 52 into the processing chamber 10. The gas supplied from the gas inlet 52 is used to cool the wafer 11 or is used as purge gas to push gas within the processing chamber 10 out of the processing chamber 10.

A gas supplying unit is constituted by the gas source 55, the gas inlet 52, the flow rate controller 54 and the valve 53. The flow rate controller 54 and the valve 53 are electrically connected to and controlled by the control unit 80.

As shown in FIG. 1, a gas exhaust pipe 62 for exhausting gas within the processing chamber 10 is provided at a side wall of the processing chamber 10 in the lower part of the rectangular processing vessel 18. The gas exhaust pipe 62 is connected to a pressure regulating valve 63 and a vacuum pump 64, which is an exhauster, in this order from an upstream. The internal pressure of the processing chamber 10 is adjusted to a predetermined value by regulating the degree of an opening of the pressure regulating valve 63.

A gas exhaust unit is constituted by the gas exhaust pipe 62, the pressure regulating valve 63 and the vacuum pump 64. The pressure regulating valve 63 and the vacuum pump 64 are electrically connected to and controlled by the control unit 80.

As shown in FIG. 1, a wafer transfer gate 71 for transferring the wafer 11 into/out of the processing chamber 10 is provided at one side of the processing vessel 18. The wafer transfer gate 71 is provided with a gate valve 72. When the gate valve 72 is opened by a gate valve driver 73, the processing chamber 10 connects with a transfer chamber via the wafer transfer gate 71.

A transfer robot (not shown) for transferring the wafer 11 is provided within the transfer chamber. The transfer robot has a transfer arm for supporting the wafer 11 while the wafer 11 is being transferred. By opening the gate valve 72, the transfer robot can transfer the wafer 11 between the processing chamber 10 and the transfer chamber.

The substrate processing apparatus 100 includes the control unit 80 for controlling operation of various components of the substrate processing apparatus 100, such as the microwave generator 20, the gate valve driver 73, the transfer robot, the flow rate controller 54, the valve 53, the pressure regulating valve 63, the rotation driver 32 and so on.

Next, detailed configuration of the substrate processing apparatus according to this embodiment will be described.

The microwave supplied into the processing chamber 10 repeatedly reflects against the walls of the processing chamber 10. The microwave also reflects in different directions within the processing chamber 10. Thus, the processing chamber 10 is filled with the microwave. The microwave irradiated onto the wafer 11 within the processing chamber 10 is absorbed by the wafer 11 which is then dielectrically heated by the microwave.

The microwave launched from the waveguide launch port 22 decreases in its energy whenever it impacts on the walls of the processing chamber 10.

In processing the wafer 11, the wafer 11 can be rapidly heated by irradiating a microwave having high energy on the wafer 11. Results of our studies show that direct irradiation of a wafer with a microwave provides a greater substrate reforming effect than in the case of processing the wafer under a state that a reflected wave is dominant.

However, in the case of directly irradiating the wafer 11 with the microwave, since the size of the waveguide launch port 22 is small and the microwave cannot be significantly spread after being launched from the waveguide launch port 22, it is not easy to uniformalize the energy of the microwave irradiated on the front surface of the wafer 11.

In addition, even with direct irradiation of the wafer 11 with the microwave, all of its energy is not absorbed in the wafer 11, but some is reflected from the front surface of the wafer or is transmitted through the wafer. This reflected wave causes a standing wave in the processing chamber 10. When the standing wave is generated in the processing chamber 10, the surface of the wafer has greater-heated portions and less-heated portions. This results in heating ununiformity of the wafer 11, which acts as one factor for the deterioration of uniformity of film quality on the surface of the wafer.

Accordingly, in this embodiment, the waveguide launch port 22 is provided in the top wall of the processing chamber 10 and the distance between the waveguide launch port 22 and the front surface of the wafer 11 supported on the substrate support pins 13 is set to be shorter than one wavelength of the supplied microwave. In this example, a frequency of the microwave used is 5.8 GHz and the distance is set to be shorter than a microwave wavelength of 51.7 mm. It is considered that a direct microwave launched from the waveguide launch port 22 is dominant in a range of distance shorter than one wavelength from the waveguide launch port 22. As used herein, the term "dominant" refers to a condition having a high density of the direct microwave. As described above, since the microwave with which the wafer 11 is irradiated is dominantly the direct microwave launched from the waveguide launch port 22 and an effect of the standing wave in the processing chamber 10 can be relatively small, it is possible to rapidly heat the wafer 11 near the waveguide launch port 22. Further, thermal history may not be stored in regions of the wafer 11 other than the region facing the waveguide launch port 22.

In addition, in this embodiment, the distance between the waveguide launch port 22 and the front surface of the wafer 11 supported on the substrate support pins 13 is set to an odd multiple of ¼ wavelength ($\lambda/4$) of the supplied microwave. Specifically, the frequency of the microwave used is set to 5.8 GHz and the distance is set to 12.9 mm which is equal to ¼ of the microwave wavelength of 51.7 mm. This configuration allows the wafer 11 to be placed at a peak position (or convex position) of the microwave, thereby providing high heating efficiency of the wafer 11.

However, "the distance between the waveguide launch port 22 and the front surface of the wafer 11 supported on the substrate support pins 13 is set to be shorter than one wavelength of the supplied microwave" or "the distance between the waveguide launch port 22 and the front surface of the wafer 11 supported on the substrate support pins 13 is set to an odd multiple of ¼ wavelength ($\lambda/4$) of the supplied microwave" means heating only a portion of the wafer 11 near the waveguide launch port 22, which results in low uniformity on the wafer surface.

Accordingly, in this embodiment, the central position of the waveguide launch port 22 is deviated from the central position of the wafer 11 supported on the substrate support pins 13 and the waveguide launch port 22 faces a portion of the front surface of the wafer 11 supported on the substrate support pins 13. In this embodiment, the diameter of the wafer 11 is 300 mm and the distance between the central position of the waveguide launch port 22 and the central position of the wafer 11 is 90 mm. In this manner, it is configured so that the microwave launched from the waveguide launch port 22 scans the wafer surface by deviating the central position of the waveguide launch port 22 from the central position of the wafer 11 and rotating the wafer 11 in a horizontal direction around the rotation axis 31 of the substrate supporting table 12 by the rotation driver 32.

In other words, a relative position of the substrate support member in the horizontal direction with respect to the waveguide launch port 22 is changed by the rotation driver 32. Also, a relative position of the waveguide launch port 22 in the horizontal direction with respect to the wafer 11 supported on the substrate support pins 13 is changed such that the waveguide launch port 22 intermittently faces a particular portion of the front surface of the wafer 11 supported on the substrate support pins 13.

In this manner, by rotating the wafer 11 with the waveguide launch port 22 deviated from the central position of the wafer 11, it is possible to heat the wafer more uniformly and heat a targeted region in the wafer 11 intensively and rapidly while providing a low thermal history for other regions. The reason for this is as follows. A region in the wafer 11 immediately below the waveguide launch port 22 which launches the microwave is subjected to the highest microwave energy and hence is well heated. Other regions are subjected to relatively low microwave energy and are hence likely to be less heated. Accordingly, a particular point on the wafer 11 under rotation is rapidly heated when it lies immediately below the waveguide launch port 22 and, when it moves away from the waveguide launch port 22, the point is unlikely to be heated. Further, regions other than the region which lies immediately below the waveguide launch port 22 are cooled by the substrate supporting table 12, as will be described later. That is, the cooling efficiency is higher than the heating efficiency. As a result, the thermal history of the point decreases.

Figure 2:
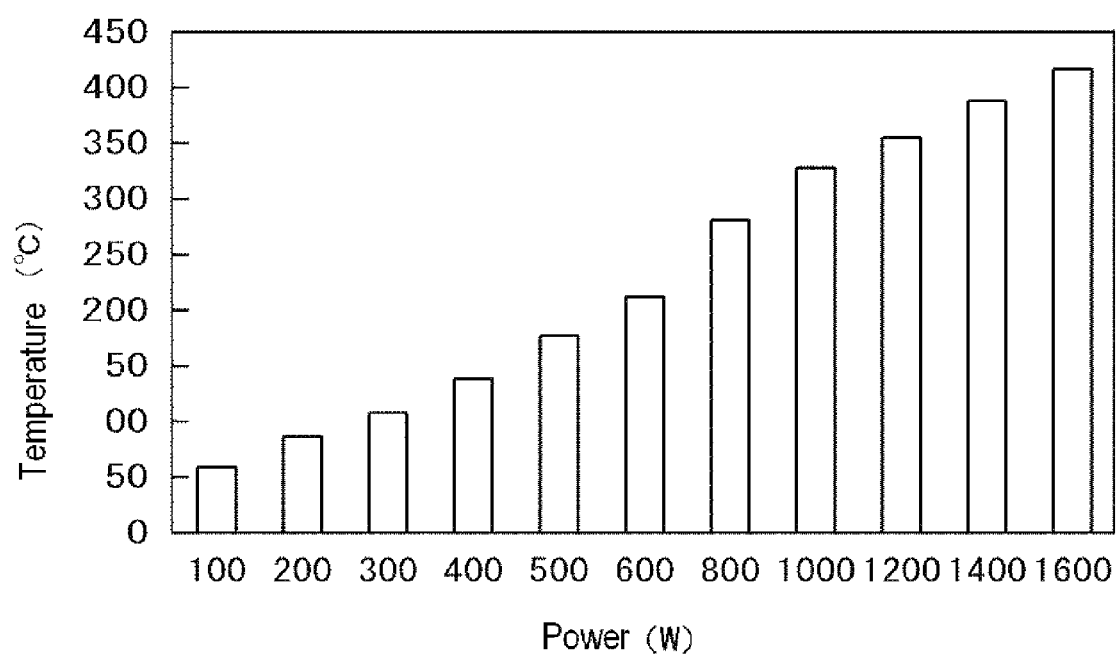
FIG. 2 is a diagram showing one example of a relationship between microwave power and substrate temperature.

The temperature of the wafer 11 is proportional to the power of the microwave. FIG. 2 shows one example of a relationship between microwave power and wafer temperature when a silicon wafer is irradiated with a microwave. As shown in FIG. 2, higher microwave power provides a higher wafer temperature.

The wafer temperature also depends on the size and shape of the processing chamber, position of the waveguide launch port of the microwave, and position of the wafer. Wafer temperature values shown herein are only examples. However, the relationship of higher microwave power providing a higher wafer temperature is kept unchanged.

In addition, as described above, when the substrate support pins 13 are made of a material having a low heat transfer property, such as quartz, it is possible to prevent heat of the wafer 11 from being transferred to the substrate supporting table 12. As used herein, the term "low heat transfer property" refers to, at least, a heat transfer property lower than that of the substrate supporting table 12. This allows the wafer 11 to be uniformly heated. For example, if the substrate supporting table 12 is made of a material having a high heat transfer property, such as metal, heat relief due to thermal conduction from the wafer 11 to the substrate support pins 13 is increased, which results in a localized distribution of low temperature in the wafer 11, which makes it difficult to heat the surface of the wafer 11 uniformly.

Figure 3:
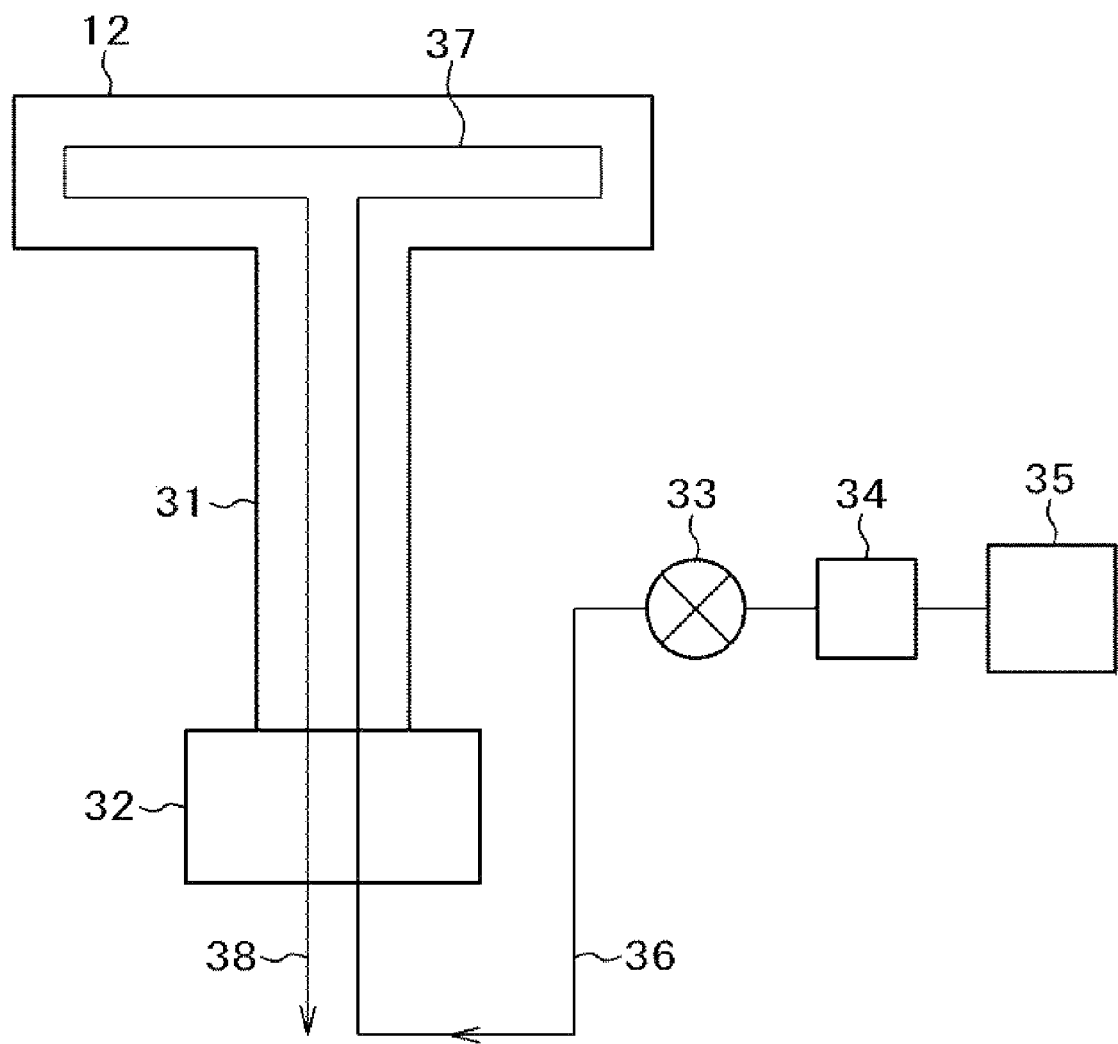
FIG. 3 is a schematic vertical sectional view of a substrate supporting table according to an embodiment of the present disclosure.

As shown in FIG. 3, in this embodiment, a coolant passage 37 is provided within the substrate supporting table 12 through which a coolant for cooling the wafer 11 can flow and the substrate supporting table 12 acts as a substrate cooling station. FIG. 3 is a schematic vertical sectional view of the substrate supporting table according to this embodiment. In this embodiment, water is used as the coolant. In other embodiments, other coolant such as cooling chiller and the like may be used as the coolant. The coolant passage 37 is connected to a coolant supply pipe 36 for supplying the coolant into the coolant passage 37 and a coolant discharge pipe 38 for discharging the coolant out of the coolant passage 37 to the outside of the processing chamber 10. The coolant supply pipe 36 is connected to a gate valve 33 for opening/closing the coolant supply pipe 36, a flow rate controller 34 for controlling a coolant flow rate and a coolant source 35 in this order from a downstream. The gate valve 33 and the flow rate controller 34 are electrically connected to and controlled by the control unit 80.

Figure 4:
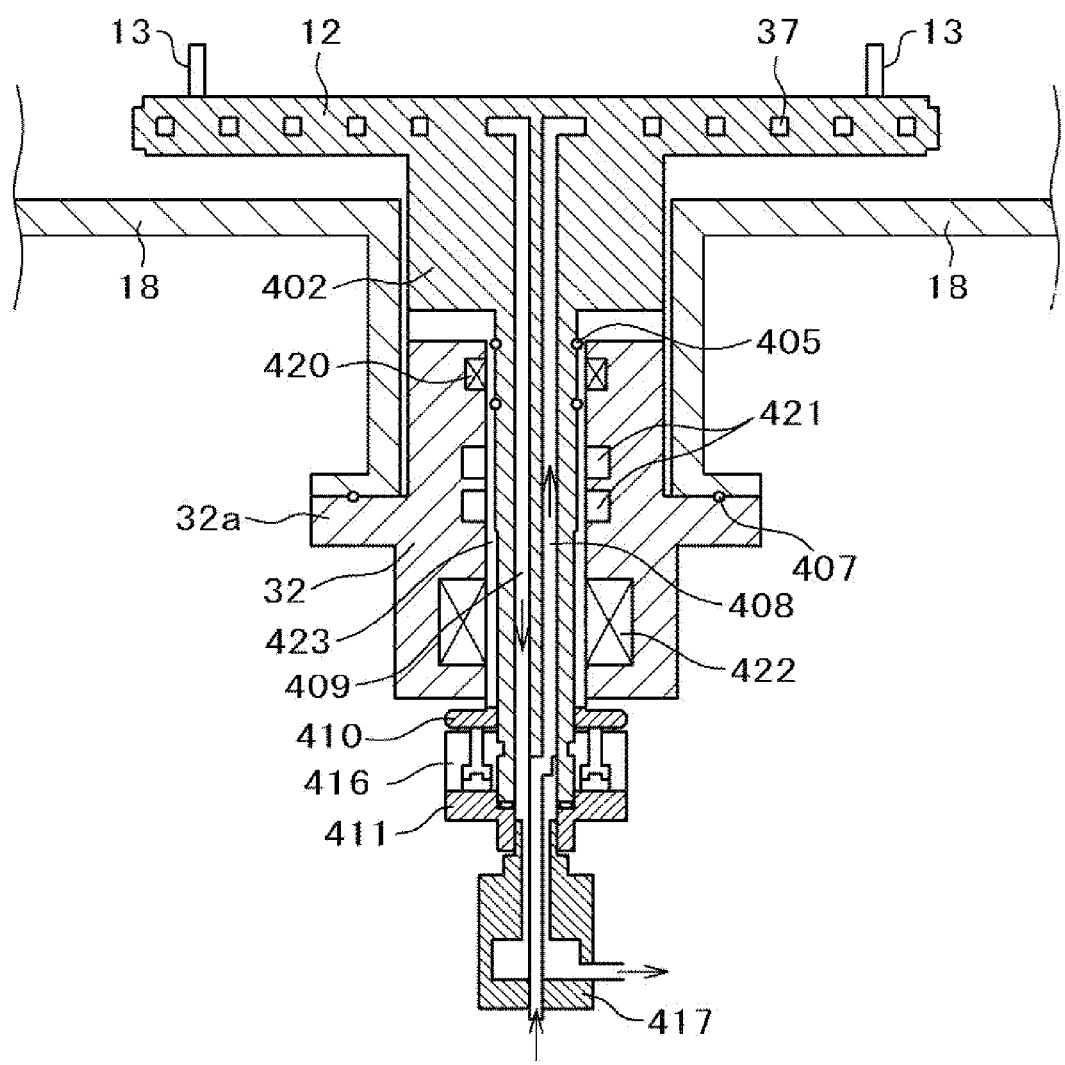
FIG. 4 is a side sectional view of a substrate supporting table and a support mechanism thereof according to an embodiment of the present disclosure.
Figure 5:
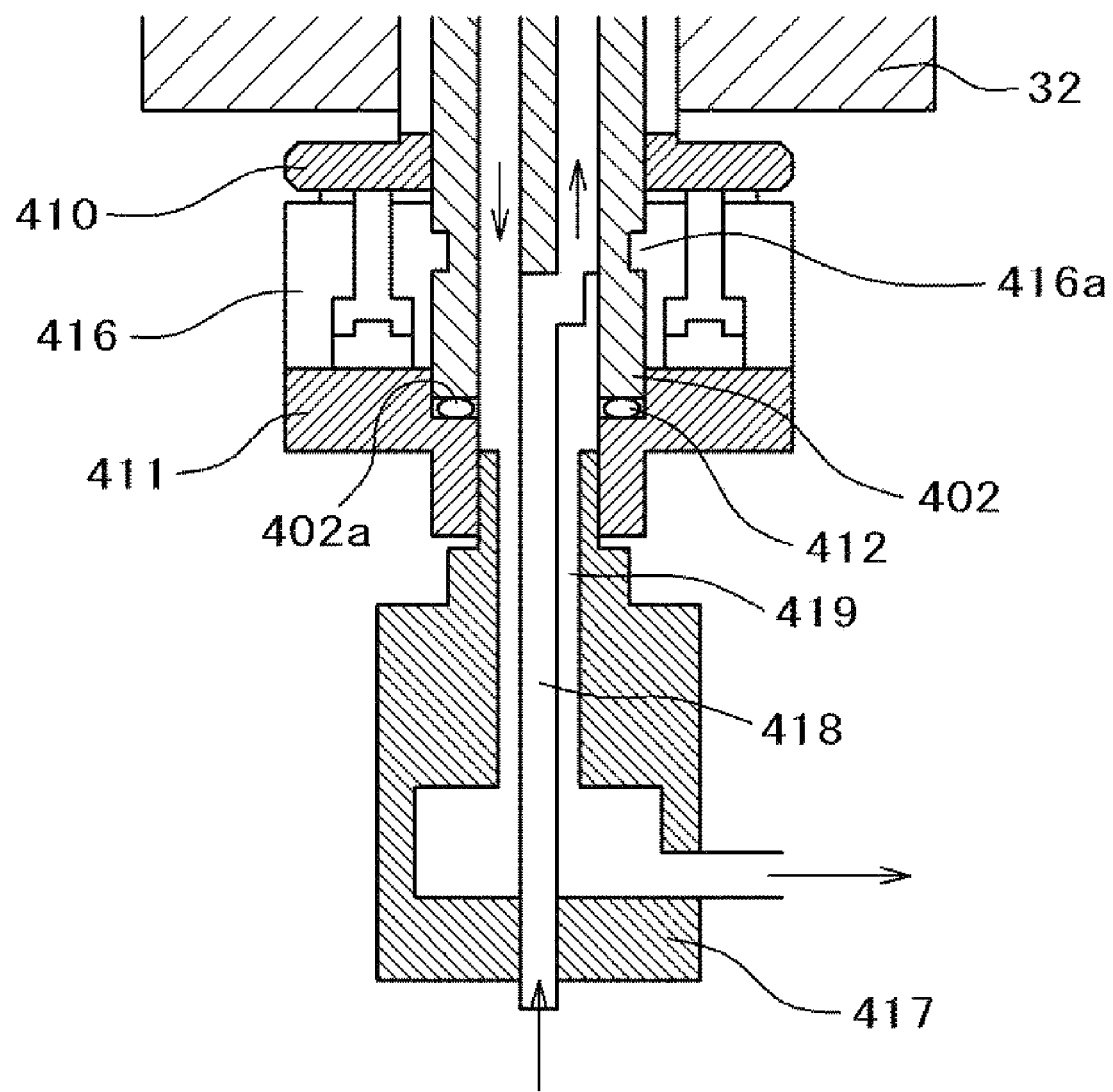
FIG. 5 is a partially enlarged view of FIG. 4.

The substrate supporting table 12 and its peripheral structure will be described in detail with reference to FIG. 4 and FIG. 5. FIG. 4 is a side sectional view of the substrate supporting table and a substrate supporting table support mechanism according to this embodiment. FIG. 5 is a partially enlarged view of FIG. 4.

As shown in FIG. 4, the substrate supporting table 12 is provided with the coolant passage 37. The coolant passage 37 is formed in the entire substrate supporting table 12 to cool the substrate uniformly. An example of the coolant may include Galden® HT200.

A shaft 402 constituting the rotation axis 31 is a support member for supporting the substrate supporting table 12. The shaft 402 contains a coolant (refrigerant) passage in which flows a coolant supplied into the coolant passage 37 of the substrate supporting table 12 and flows a coolant discharged from the coolant passage 37. The shaft 402 is made of aluminum. The shaft 402 has a circular horizontal cross section. The coolant passage contained in the shaft 402 includes a first coolant supplying path 408 for supplying a coolant from a coolant inlet/outlet unit 417 into the coolant passage 37 and a first coolant discharging path 409 for flowing a coolant discharged from the coolant passage 37. The first coolant supplying path 408 and the first coolant discharging path 409 are arranged to be in parallel to and separated from each other inside the shaft 402, as shown in FIG. 4.

Reference numeral 32 denotes the rotation driver which rotates the shaft 402 in a horizontal direction and is made of SUS (stainless steel). The side of the shaft 402 is covered with a hollow shaft 423. The hollow shaft 423 holds the shaft 402 and is horizontally rotated along with the shaft 402. The hollow shaft 423 is used to protect the shaft 402 against rotation friction or the like. The hollow shaft 423 is made of SUS. An O-ring 405 is provided between the shaft 402 and the hollow shaft 423. The O-ring 405 is used to prevent the shaft 402 from shaking and gas from leaking out of the processing chamber 10. The rotation driver 32 is provided with a magnetic fluid seal 420 as a vacuum seal, a bearing 421, and a motor 422 at a side contacting the hollow shaft 423. Rotational motion of the motor 422 is delivered to the hollow shaft 423 to allow the shaft 402 to be horizontally rotated.

A flange provided in a casing of the rotation driver 32 is fixed to the bottom of the processing vessel 18. The O-ring 407 is used to prevent gas from leaking out of the processing chamber 10.

As shown in FIG. 5, a lower leading end of the shaft 402 is inserted in a shaft receiver 411. A fixation ring 416 is provided above the shaft receiver 411 and a compression ring 410 is provided above the fixation ring 416. The shaft receiver 411, the fixation ring 416 and the compression ring 410 constitute a connector which connects the shaft 402 and the coolant inlet/outlet unit 417, and are horizontally rotated along with the shaft 402.

As shown in FIG. 5, the coolant inlet/outlet unit 417 is provided below the shaft receiver 411. The coolant inlet/outlet unit 417 remains stationary without being horizontally rotated when the shaft 402 is horizontally rotated.

The coolant inlet/outlet unit 417 is made of SUS. The coolant inlet/outlet unit 417 has a rotor assembled in its casing and supplies/discharges a coolant into/from the shaft 402 via the connector without leaking the coolant. The coolant inlet/outlet unit 417 is provided with a second coolant supplying path 418 and a second coolant discharging path 419. The second coolant discharging path 419 is arranged in concentricity with the second coolant supplying path 418 to surround the second coolant supplying path 418. That is, the second coolant supplying path corresponds to an inner axis and the second coolant discharging path 419 corresponds to an outer axis provided to surround the inner axis. In this manner, the second coolant supplying path 418 and the second coolant discharging path 419 constitute a double axis. The shaft receiver 411 can supply a coolant from the inner axis and discharge a coolant out of the outer axis even during rotation since it is horizontally rotated around the double axis.

As shown in FIG. 5, a leading end 402a of the shaft 402 contacts an O-ring 412 to prevent leakage of a coolant. The first coolant supplying path 408 of the shaft 402 and the second coolant supplying path 418 of the coolant inlet/outlet unit 417 are interconnected to provide an overlapping double pipe, and the first coolant discharging path 409 of the shaft 402 and the second coolant discharging path 419 of the coolant inlet/outlet unit 417 are interconnected to provide an overlapping double pipe.

The first coolant supplying path 408 and first coolant discharging path 409 of the shaft 402 are arranged to be in parallel to and separated from each other. Meanwhile, the second coolant discharging path 419 of the coolant inlet/outlet unit 417 is arranged in concentricity with the second coolant supplying path 418 to surround the second coolant supplying path 418. In this manner, the shaft 402 can be easily fabricated by making the coolant passages in the shaft 402 in parallel to and separated from each other without taking a double axis structure.

As shown in FIG. 5, the fixation ring 416 is provided above the shaft receiver 411. The fixation ring 416 is of a ring shape (doughnut shape) having a thickness in a vertical direction and has an approximately bilateral symmetry structure which can be divided into two parts along a vertical direction. The fixation ring 416 (which is dividable into two parts) is inserted in a side of the leading end of the shaft 402. A convex flange 416a is provided in the fixation ring 416. The fixation ring 416 is fixed to the shaft 402 by combining and fixing the fixation ring 416 by a horizontal bolt (not shown) under a state where the flange 416a is fitted into a concave portion of the side of the leading end of the shaft 402. In addition, the shaft receiver 411 is fixed to the fixation ring 416 by a bolt (not shown) or the like. Thus, the shaft receiver 411 is rotated along with the shaft 402.

Next, a distance between the substrate supporting table and the substrate will be described.

Since the substrate supporting table 12 is made of a conductive metal material, an electric potential of the microwave in the substrate supporting table 12 becomes zero. Accordingly, if the wafer 11 is directly placed on the substrate supporting table 12, an intensity of an electric field of the microwave becomes weak. Accordingly, in this embodiment, the wafer 11 is placed at a position of ¼ wavelength ($\lambda/4$) or an odd multiple of $\lambda/4$ of the microwave from a surface of the substrate supporting table 12. As used herein, the phrase "surface of the substrate supporting table 12" refers to the surface of the substrate supporting table 12 that faces the rear surface of the wafer. Since an electric field is strong at the position of an odd multiple of $\lambda/4$, the wafer 11 can be efficiently heated with the microwave.

Specifically, in this embodiment, since the microwave has a fixed frequency of, for example, 5.8 GHz, and a wavelength of, for example, 51.7 mm, the distance from the surface of the substrate supporting table 12 to the wafer 11 is set to be 12.9 mm. In other words, the distance between the top of the substrate support pins 13 and the surface of the substrate supporting table 12 opposing the wafer 11 is set to correspond to a ¼ wavelength of the supplied microwave when the substrate is processed.

This configuration allows the wafer 11 to be placed at a peak position (or convex position) of the microwave, thereby providing high heating efficiency of the wafer 11. It is expected that the high heating efficiency allows other films to be heated due to thermal conduction from a dielectric film of the wafer 11. However, by placing a metal substrate supporting table 12 including a cooler and having an area equal to or larger than the size of the wafer 11 at a position facing the rear surface of the wafer 11, heat can be drawn away from the entire rear surface of the wafer 11. As a result, the wafer 11 can be uniformly cooled to prevent films other than the dielectric film on the wafer 11 from being heated.

A frequency of the microwave may be changed (varied) with time. In that case, the distance from the surface of the substrate supporting table 12 to the wafer 11 may be calculated from a wavelength of a representative frequency in a varying frequency band. For example, for a varying frequency band of 5.8 GHz to 7.0 GHz, the center frequency thereof may be set as a representative frequency and the distance from the surface of the substrate supporting table 12 to the wafer 11 may be set to be 11.5 mm for a wavelength of 46 mm of the representative frequency of 6.4 GHz.

Further, a plurality of power supplies having different fixed frequencies may be provided to supply different microwaves having different frequencies to be processed later.

Next, a substrate processing operation according to this embodiment in the substrate processing apparatus 100 will be described. The substrate processing operation according to this embodiment is one of a plurality of processes for manufacturing a semiconductor device. The substrate processing operation is controlled by the control unit 80.

(Substrate Loading Process)

In a substrate loading process of loading the wafer 11 in the processing chamber 10, the gate valve 72 is first opened so that the processing chamber 10 connects with the transfer chamber. Next, the wafer 11 to be processed is transferred from the transfer chamber into the processing chamber 10 by the transfer robot. The wafer 11 transferred into the processing chamber 10 is placed on top of the substrate support pins 13 by the transfer robot and supported by the substrate support pins 13. Next, when the carrying robot returns from the processing chamber 10 to the carrying chamber, the gate valve 72 is closed.

(Nitrogen Gas Replacing Process)

Next, the atmosphere within the processing chamber 10 is replaced with an inert gas atmosphere to prevent a heating process, which will be described below, from having an adverse effect on the wafer 11. $N_2$ gas is supplied from the gas inlet 52 into the processing chamber 10 while discharging gas (atmosphere) within the processing chamber 10 from the gas exhaust pipe 62 by the vacuum pump 64. At this time, the internal pressure of the processing chamber 10 is adjusted to a predetermined pressure (the air pressure in this embodiment) by the pressure regulating valve 63.

(Heating Process)

Next, after the wafer 11 is rotated by the rotation driver 32 to reach a predetermined rotation speed and the rotation speed of the wafer 11 remains constant, a microwave generated in the microwave generator 20 is supplied into the processing chamber 10 via the waveguide launch port 22 and the front surface of the wafer 11 is irradiated with the microwave. If the microwave is supplied before the wafer 11 is rotated at the predetermined speed, the intensity of irradiation of the microwave is varied depending on sites on the wafer 11, which is not preferable from a standpoint of uniform heating of the wafer 11.

In this example, such microwave irradiation heats a high-k film on the front surface of the wafer 11 to 100 to 600° C. to reform the high-k film, i.e., remove impurities such as C, H and so on from the high-k film, to achieve a densified and stable insulating thin film. In this manner, the wafer 11 can be more uniformly heated by rotating the wafer 11.

A dielectric such as a high-k film or the like has microwave absorptivity varying depending on its dielectric constant. A higher dielectric constant provides higher microwave absorptivity. Our studies showed that irradiation of a wafer with a high power microwave provides more reforming of a dielectric film on a wafer than with a low power microwave. In addition, we have found that heating by a microwave is characterized by dielectric heating depending on permittivity $\in$ and dielectric tangent tan δ and, when materials having such different physical properties are simultaneously heated, only a material which is more likely to be heated, that is, a material having higher permittivity, is selectively heated.

In this manner, using the fact that material having higher permittivity is rapidly heated whereas material having lower permittivity is slowly heated, since irradiation time of the microwave taken for desired heating of the dielectric can be shortened by irradiating the high power microwave, it is possible to selectively heat the material having higher permittivity by completing irradiation of the microwave before other materials are heated.

As for annealing of the high-k film, the high-k film has higher permittivity $\in$ than that of silicon which is a material of a wafer substrate. For example, permittivity $\in$ of silicon is 9.6, while permittivities $\in$ of HfO and ZrO films are 25 and 35, respectively. Accordingly, when a wafer with the high-k film formed thereon is irradiated with the microwave, only the High-k film can be selectively heated.

Our studies showed that higher power microwave irradiation provides a greater film reforming effect. The higher power microwave irradiation may also result in a faster increase in the temperature of the high-k film.

In comparison, if a relatively low power microwave is irradiated for a long time, the temperature of the entire wafer is increased during the reforming process. This is because the temperature of the silicon also increases due to dielectric heating of silicon itself by the microwave and thermal conduction from the high-k film on the front surface of the wafer irradiated with the microwave to the silicon in the rear surface of the wafer.

It is considered that the reason for the great film reforming effect by the high power microwave irradiation is that the dielectric can be heated by dielectric heating to a high temperature until the temperature of the entire wafer reaches its upper limit of temperature.

Accordingly, in this embodiment, the front surface of the wafer having the high-k film formed thereon is irradiated with a high energy direct microwave to provide a greater difference in heating between the dielectric and the wafer. In addition, the wafer 11 is rotated to suppress an increase in temperature of the wafer 11. This is because the wafer 11 is rapidly heated in the time period in which the wafer 11 stays near the waveguide launch port 22, whereas the wafer 11 decreases in temperature as it is unlikely to be heated when it moves out from below the waveguide launch port 22. This makes it possible to suppress an increase in the temperature of the entire wafer. More preferably, an increase in the temperature of the wafer 11 may be suppressed by cooling the wafer 11 during irradiation of the microwave. The wafer 11 may be cooled by, for example, increasing an amount of $N_2$ gas passing through the processing chamber 10 or circulating a coolant in the coolant passage 37 within the substrate supporting table 12.

In addition, in the heating process, the control unit 80 opens the valve 53 to supply the $N_2$ gas from the gas inlet 52 into the processing chamber 10, while adjusting the internal pressure of the processing chamber 10 to a predetermined value (the air pressure in this embodiment) by the pressure regulating valve 63 to exhaust the $N_2$ gas within the processing chamber 10 from the gas exhaust pipe 62. Thus, in the heating process, the internal pressure of the processing chamber 10 is kept at the predetermined pressure value. In this example, the heating process was performed for 5 minutes under the conditions where power of a microwave having a frequency of 5.8 GHz is 1600 W and the internal pressure of the processing chamber 10 is the air pressure. At this time, the wafer 11 may be further cooled by controlling the flow rate of inert gas (e.g., $N_2$ gas) supplied into the processing chamber 10.

When the cooling effect of the $N_2$ gas is in active use, the cooling effect by the gas can be further improved by providing the gas inlet 52 in the substrate supporting table 12 and flowing the gas between the wafer 11 and the substrate supporting table 12. The temperature of the wafer 11 may be also controlled by controlling the flow rate of gas.

In addition, although the $N_2$ gas is used in this embodiment, other gas having a large heat transfer coefficient, such as diluted He gas or the like, may be added to the $N_2$ gas for further improvement of the substrate cooling effect as long as there is no problem in the process and stability.

After performing the substrate heating process for a predetermined period of time with the supply of the microwave as described above, the supply of the microwave is stopped. After stopping the supply of the microwave, the rotation of the wafer 11 is stopped. If the rotation of the wafer 11 is stopped before the supply of the microwave is stopped, irradiation intensity of the microwave varies depending on regions of the wafer 11, which is not preferable from a standpoint of uniform heating of the wafer 11.

(Substrate Unloading Process)

After the cooling process is completed, the heated wafer 11 is unloaded from the processing chamber 10 into the transfer chamber in the opposite order to the order shown in the above-described substrate loading process.

The above-described embodiment may provide at least the following effects (1) to (7).

(1) It is possible to heat the substrate uniformly and suppress an increase in the temperature of the substrate by deviating the central position of the microwave waveguide launch port from the central position of the substrate and rotating the substrate. In addition, it is possible to intensively and rapidly heat a targeted region on the substrate while providing a low thermal history for other regions.

(2) It is possible to heat the substrate uniformly since the substrate is heated by irradiating the front surface of the substrate with the microwave after the rotation speed of the substrate reaches a constant predetermined value and then the rotation of substrate is stopped after the supply of microwave is stopped.

(3) It is possible to efficiently heat the substrate and relatively reduce an effect of a reflected microwave since the wafer can be irradiated with a high energy microwave by setting the distance between the waveguide launch port 22 and the front surface of the substrate to be less than one wavelength of the supplied microwave in the substrate heating process and mainly using the direct microwave launched from the waveguide launch port 22.

(4) Substrate heating efficiency is high since the substrate can be located at a peak position of the microwave launched from the waveguide launch port 22 by setting the distance between the waveguide launch port 22 and the front surface of the substrate to be an odd multiple of ¼ wavelength of the supplied microwave in the substrate heating process.

(5) Substrate heating efficiency is high since the substrate can be located at a peak position of the microwave launched from the waveguide launch port 22 by setting the distance between the rear surface of the substrate (the top of the substrate support member) and the surface of a conductive pedestal, which faces the rear surface of the substrate, to be an odd multiple of ¼ wavelength of the supplied microwave in the substrate heating process.

(6) It is possible to prevent heat from escaping from the substrate support pins and hence uniformly heat the substrate since the substrate support pins are made of material having a low heat transfer property.

(7) It is possible to selectively heat a material having a high permittivity.

The present disclosure is not limited to the above embodiment but it should be understood that the present disclosure may be modified in various ways without departing from the spirit and scope of the present disclosure.

Although in the disclosed embodiment the waveguide launch port 22 is fixed and the substrate support member is horizontally rotated, instead, the substrate support member may be fixed, an antenna may be formed as a new waveguide launch port connected below the waveguide launch port 22 and the new waveguide launch port may be horizontally rotated with the substrate central position as a rotation axis. However, it is considered that if a rotation mechanism needs to be provided at a certain location above the substrate in order to rotate the new waveguide launch port, dust may be produced in or near the waveguide opening rotation axis due to mechanical contact or the like and may drop on the substrate, which may result in contamination of the substrate. Therefore, it is more preferable to fix the waveguide launch port 22 and rotate the substrate support member horizontally.

In addition, although in the disclosed embodiment the substrate support pins 13 are used as a member for supporting the substrate directly, the substrate may be supported by members other than the pins.

Further, although in the disclosed embodiment an object to be processed is a wafer, the object may be a photo mask, a printed circuit board, a liquid crystal panel, a compact disk, a magnetic disk or the like.

Additionally, the present disclosure may encompass at least the following aspects.

A first aspect of the present disclosure may provide a substrate processing apparatus including: a processing chamber configured to process a substrate; a substrate support member provided within the processing chamber to support the substrate; a microwave generator provided outside the processing chamber; a waveguide launch port configured to supply a microwave generated by the microwave generator into the processing chamber, wherein the central position of the waveguide launch port is deviated from the central position of the substrate supported on the substrate support member and the waveguide launch port faces a portion of a front surface of the substrate supported on the substrate support member; and a control unit configured to change a relative position of the substrate support member in a horizontal direction with respect to the waveguide launch port.

With the above configuration of the substrate processing apparatus, it is possible to heat the substrate uniformly while suppressing the thermal history of the entire substrate by deviating the central position of the microwave waveguide launch port from the central position of the substrate and changing the relative position of the substrate support member with respect to the waveguide launch port (for example, by rotating the substrate). In addition, it is possible to intensively and rapidly heat a targeted region on the substrate while providing a low thermal history for other regions.

A second aspect of the present disclosure may provide a substrate processing apparatus according to the first aspect, wherein the substrate support member is horizontally rotated around a rotation axis of the substrate support member and the waveguide launch port is fixed at a position deviated from the rotation axis of the substrate support member.

With the above configuration of the substrate processing apparatus, the change of a relative position of the substrate support member with respect to the waveguide launch port can be easily realized and the rotation mechanism can be provided below the substrate, which may result in less contamination of the substrate.

A third aspect of the present disclosure may provide a substrate processing apparatus according to the first or second aspect, wherein a distance between the waveguide launch port and the substrate supported on the substrate support member is shorter than a wavelength of the supplied microwave.

With the above configuration of the substrate processing apparatus, since the microwave with which the substrate is irradiated is dominantly a direct microwave launched from the wave guide and hence a higher energy microwave is used, it is possible to heat a dielectric more efficiently. In addition, since the direct microwave does not materially contact regions other than a region immediately below the waveguide launch port and therefore thermal history is not stored in the regions, it is possible to more intensively and rapidly heat a targeted region in the substrate while providing a low thermal history for other regions.

A fourth aspect of the present disclosure may provide a substrate processing apparatus according to the first or third aspect, wherein a distance between the waveguide launch port and the substrate supported on the substrate support member corresponds to an odd multiple of ¼ wavelength of the microwave launched from the waveguide launch port.

With the above configuration of the substrate processing apparatus, since the substrate can be placed at a peak position (or convex position) of the direct microwave launched from the waveguide launch port, an electric field of the microwave at the substrate height position is strengthened, thereby providing high heating efficiency of the substrate.

A fifth aspect of the present disclosure may provide a substrate processing apparatus according to the first or fourth aspect, wherein the substrate support member includes substrate support pins on which the substrate is supported, and a conductive pedestal provided below the substrate support pins where the distance between the top of the substrate support pins and the conductive pedestal corresponds to an odd multiple of ¼ wavelength of the supplied microwave in a substrate heating process.

With the above configuration of the substrate processing apparatus, since the substrate can be placed at a peak position (or convex position) of the microwave launched from the waveguide launch port, an electric field of the microwave at the substrate height position is strengthened, thereby providing high heating efficiency of the substrate.

A sixth aspect of the present disclosure may provide a substrate processing apparatus according to the fifth aspect, wherein the conductive pedestal is a metal pedestal containing a coolant passage.

With the above configuration of the substrate processing apparatus, since an electric field of the microwave at the substrate height position is strengthened, it is possible to efficiently heat a film such as a high-k film formed on the substrate and suppress heating of the entire substrate.

A seventh aspect of the present disclosure may provide a substrate processing apparatus according to the first or sixth aspect, wherein the control unit controls the microwave to be supplied into the processing chamber after starting the change of relative position of the substrate support member in a horizontal direction with respect to the waveguide launch port.

With the above configuration of the substrate processing apparatus, since the microwave is supplied after the change of relative position of the substrate support member (for example, after the rotation of the substrate support member) in a horizontal direction with respect to the waveguide launch port is stabilized, it is possible to more uniformly heat the substrate.

An eighth aspect of the present disclosure may provide a substrate processing apparatus including: a processing chamber configured to process a substrate; a substrate support member provided within the processing chamber to support the substrate; a microwave generator provided outside the processing chamber; a waveguide launch port configured to supply a microwave generated by the microwave generator into the processing chamber, wherein the central position of the waveguide launch port is deviated from the central position of the substrate supported on the substrate support member and the waveguide launch port faces a portion of a front surface of the supported substrate; and a control unit configured to change a relative position of the waveguide launch port in a horizontal direction with respect to the supported substrate such that the waveguide launch port intermittently faces the portion of the front surface of the supported substrate.

With the above configuration of the substrate processing apparatus, it is possible to heat the substrate uniformly while suppressing the thermal history of the entire substrate by deviating the microwave waveguide launch port from the central position of the substrate and changing the relative position of the waveguide launch port with respect to the portion of the substrate (for example, by rotating the substrate) such that the waveguide launch port intermittently faces the portion of the substrate. In addition, it is possible to intensively and rapidly heat a targeted region in the substrate while providing a low thermal history for other regions.

A ninth aspect of the present disclosure may provide a method of manufacturing a semiconductor device using a substrate processing apparatus including a processing chamber configured to process a substrate, a substrate support member provided within the processing chamber to support the substrate, a microwave generator provided outside the processing chamber, a waveguide launch port configured to supply a microwave generated by the microwave generator into the processing chamber, wherein the central position of the waveguide launch port is deviated from the central position of the substrate supported on the substrate support member and the waveguide launch port faces a portion of a front surface of the substrate supported on the substrate support member, and a control unit configured to relatively rotate the substrate support member in a horizontal direction with respect to the waveguide launch port, the method including:

loading the substrate into the processing chamber; supporting the substrate on the substrate support member provided in the processing chamber; relatively rotating the substrate support member supported on the substrate support member in the horizontal direction with respect to the waveguide launch port; irradiating the front surface of the substrate with the microwave after starting rotating the substrate; and unloading the substrate out of the processing chamber.

With the above configuration of the method of manufacturing a semiconductor device, since the microwave is supplied after a rotation speed becomes constant, it is possible to heat the surface of the substrate uniformly.

A tenth aspect of the present disclosure may provide a method of manufacturing a semiconductor device according to the ninth aspect, further including: stopping the supplying of the microwave after a predetermined period of time elapses after starting the irradiating step and stopping the rotation operation of the substrate supported on the substrate support member after stopping the supplying of the microwave.

With the above configuration of the method of manufacturing a semiconductor device, since the supplying of the microwave is stopped during the rotation operation, the substrate heating process can be ended with a uniform heating state maintained.

The substrate processing apparatus and the semiconductor device manufacturing method as configured above has an effect of suppressing an increase in a substrate temperature and further restricting a thermal budget, as compared to conventional techniques, by heating the substrate with microwave irradiation, and heating the substrate more uniformly by rotating the substrate with the microwave waveguide launch port deviated from the central position of the substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
   a processing chamber configured to process a substrate;
   a substrate support member provided within the processing chamber to support the substrate;
   a microwave generator provided outside the processing chamber;
   a waveguide launch port configured to supply a microwave generated by the microwave generator into the processing chamber, wherein a central position of the waveguide launch port is deviated from a central position of the substrate supported on the substrate support member, and the waveguide launch port faces a portion of a front surface of the substrate supported on the substrate support member; and
   a control unit configured to change a relative position of the substrate support member in a horizontal direction with respect to the waveguide launch port.

2. The substrate processing apparatus of claim 1, wherein the substrate support member is horizontally rotated around a rotation axis of the substrate support member and the waveguide launch port is fixed at a position deviated from the rotation axis of the substrate support member.

3. The substrate processing apparatus of claim 1, wherein a distance between the waveguide launch port and the substrate supported on the substrate support member is shorter than a wavelength of the supplied microwave.

4. The substrate processing apparatus of claim 1, wherein a distance between the waveguide launch port and the substrate supported on the substrate support member corresponds to an odd multiple of ¼ wavelength of the microwave supplied from the waveguide launch port.

5. The substrate processing apparatus of claim 1, wherein the substrate support member comprises substrate support pins, on which the substrate is supported, and a conductive pedestal provided below the substrate support pins, and
   wherein a distance between the top of the substrate support pins and the conductive pedestal corresponds to an odd multiple of ¼ wavelength of the microwave supplied when the substrate is processed.

6. The substrate processing apparatus of claim 5, wherein the conductive pedestal is a metal pedestal including a coolant passage.

7. The substrate processing apparatus of claim 1, wherein the control unit controls the microwave generator to supply the microwave into the processing chamber after starting the change of relative position of the substrate support member in a horizontal direction with respect to the waveguide launch port.

8. A substrate processing apparatus comprising:
   a processing chamber configured to process a substrate;
   a substrate support member provided within the processing chamber to support the substrate;
   a microwave generator provided outside the processing chamber;
   a waveguide launch port configured to supply a microwave generated by the microwave generator into the processing chamber, wherein a central position of the waveguide launch port is deviated from a central position of the substrate supported on the substrate support member and the waveguide launch port faces a portion of a front surface of the supported substrate; and
   a control unit configured to change a relative position of the waveguide launch port in a horizontal direction with respect to the supported substrate such that the waveguide launch port intermittently faces the portion of the front surface of the supported substrate.

9. A method of manufacturing a semiconductor device using a substrate processing apparatus including a processing chamber configured to process a substrate, a substrate support member provided within the processing chamber to support the substrate, a microwave generator provided outside the processing chamber, a waveguide launch port configured to supply a microwave generated by the microwave generator into the processing chamber, wherein a central position of the waveguide launch port is deviated from a central position of the substrate supported on the substrate support member and the waveguide launch port faces a portion of a front surface of the substrate supported on the substrate support member, and a control unit configured to relatively rotate the substrate support member in a horizontal direction with respect to the waveguide launch port, the method comprising:
   loading the substrate into the processing chamber;
   supporting the substrate on the substrate support member provided in the processing chamber;
   relatively rotating the substrate support member supported on the substrate support member in the horizontal direction with respect to the waveguide launch port;
   irradiating the front surface of the substrate with the microwave after starting rotating the substrate; and
   unloading the substrate out of the processing chamber.

* * * * *